United States Patent [19]
Shoemaker et al.

[11] Patent Number: 5,829,121
[45] Date of Patent: *Nov. 3, 1998

[54] ANTENNA MAKING METHOD

[75] Inventors: Kevin O. Shoemaker, Lafayette; Randall P. Marx, Wheat Ridge, both of Colo.

[73] Assignee: Antennas America, Inc., Wheat Ridge, Colo.

[*] Notice: This patent issued on a continued prosecution application filed under 37 CFR 1.53(d), and is subject to the twenty year patent term provisions of 35 U.S.C. 154(a)(2).

[21] Appl. No.: 772,759

[22] Filed: Dec. 23, 1996

Related U.S. Application Data

[62] Division of Ser. No. 436,732, May 8, 1995, abandoned.

[51] Int. Cl.⁶ ....................................................... H01P 11/00
[52] U.S. Cl. ........................ 29/600; 29/601; 343/700 MS; 343/846
[58] Field of Search ........................ 29/600, 601; 83/693, 83/694; 343/700 MS, 846, 702

[56] References Cited

U.S. PATENT DOCUMENTS

| | | | |
|---|---|---|---|
| 4,038,742 | 8/1977 | Kimball et al. | 29/600 |
| 4,120,085 | 10/1978 | Peterson | 29/600 |
| 4,160,220 | 7/1979 | Stachejko | 29/600 X |
| 4,546,357 | 10/1985 | Laughon et al. | 343/702 |
| 4,706,051 | 11/1987 | Dieleman et al. | 29/600 X |
| 5,307,556 | 5/1994 | Kido | 343/700 MS |
| 5,592,150 | 1/1997 | D'Hont | 29/600 X |

FOREIGN PATENT DOCUMENTS

| | | | |
|---|---|---|---|
| 78088 | 7/1978 | Japan | 29/600 |
| 200601 | 10/1985 | Japan | 29/600 |

*Primary Examiner*—Peter Vo
*Attorney, Agent, or Firm*—Ancel W. Lewis, Jr.

[57] ABSTRACT

Single and multiple radiator element planar array antennas and a method of making are disclosed. A styrofoam dielectric substrate, a die cut conductive first layer, preferably copper foil, secured to one surface and a conductive second layer, preferably aluminum foil, on the other surface forms the ground plane. A cutting die of cutting blades in a required array on a cutting press is used to cut through the conductive layer and into the dielectric layer in a sandwich of the two to provide inexpensive, durable and dimensionally stable antennas.

7 Claims, 5 Drawing Sheets

ANTENNA MAKING METHOD

This application is a division of application Ser. No. 436,732, filed May 8, 1995 now abandoned.

TECHNICAL FIELD

This invention generally relates to antennas and more particularly to planar array antennas and a method of making same.

BACKGROUND ART

In U.S. Pat. No. 4,914,445 there are disclosed planar array antennas that are made using photolithographic or etching techniques.

DISCLOSURE OF THE INVENTION

Planar array antennas disclosed have a dielectric substrate, preferably styrofoam, a die cut thin conductive first layer secured to a first surface of the substrate and a thin conductive second layer on a second surface of the substrate forming a ground plane. The antenna is made by securing a first conductive section of a selected size to a dielectric substrate of a selected size preferably by using a section of adhesive to form a sandwich. A cutting die of a predetermined configuration is used to stamp out the planar array from the first conductive section. A thin second conductive layer, preferably aluminum foil, is positioned on the opposite surface of the substrate to form the ground plane.

BRIEF DESCRIPTION OF THE DRAWINGS

Details of this invention are described in connection with the accompanying drawings which like parts bear similar reference numerals in which.

DETAILED DESCRIPTION

Figure 1:
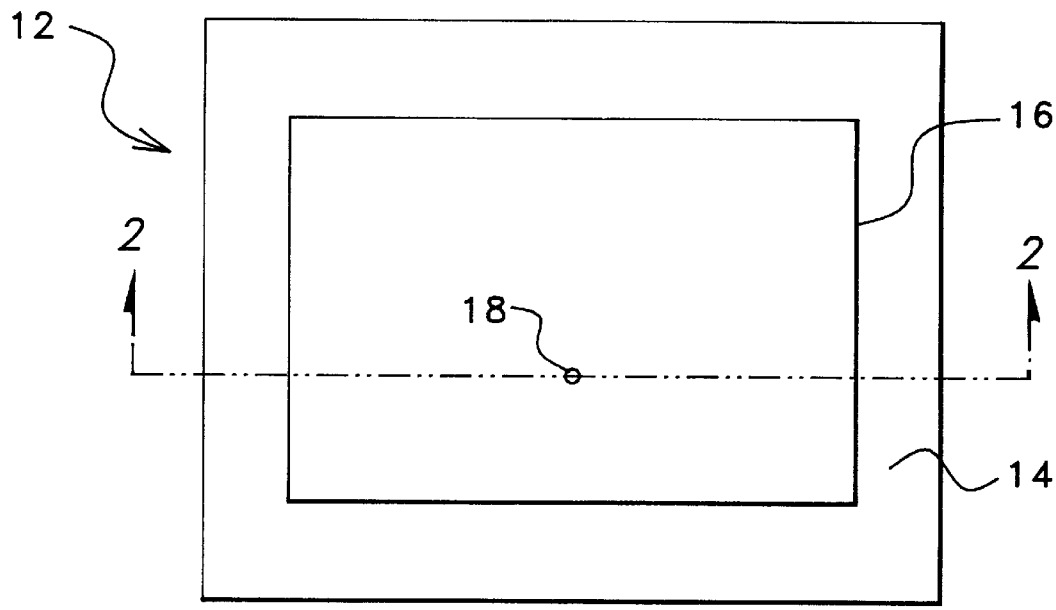
FIG. 1 is a top plan view of a single radiator element planar array antenna embodying features of the present invention.
Figure 2:
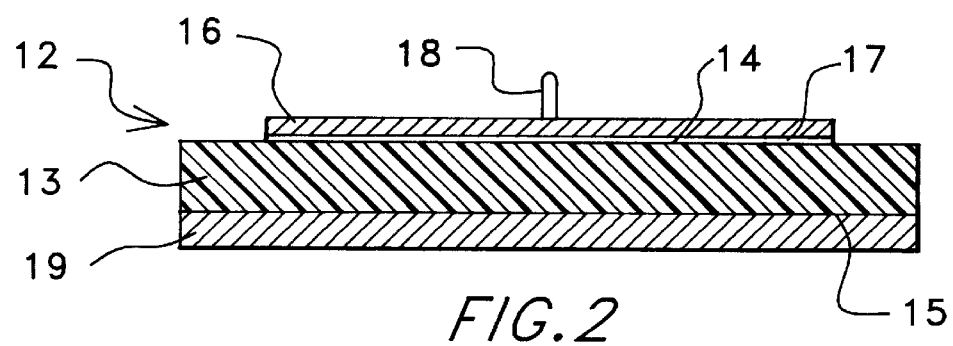
FIG. 2 is a sectional view taken along line 2—2 of FIG. 1.

Referring now to FIGS. 1 and 2 there is shown a single radiator element planar array antenna 12 having a dielectric substrate 13, preferably foam and specifically styrofoam, having a planar first surface 14 and a planar second surface 15 opposite the first surface 14.

A die cut thin conductive first layer 16 is secured to the first surface 14 by means of an adhesive layer 17, preferably a sheet adhesive. It is understood a liquid adhesive may also be used as the securing means for the first layer 16. A conductive feed pin 18 is soldered to the first layer 16 to provide a feedpoint.

A thin conductive second layer 19, preferably aluminum foil, is disposed on the second surface 15 opposite the first surface 14 to form a ground plane. The second layer 19 may be suitably held mechanically against the second surface 15 or may be secured thereto with an adhesive.

The sandwich sizes typical are 14 inch by 14 inch, 14 inch by 7 inch, and 7 inch by 7 inch. The dielectric substrate 13 preferably is of a thickness of about 0.250 inches. The thickness of the foam dielectric substrate 13 may vary according to the frequency of operation. The first layer 16 preferably is a copper foil, preferably of a thickness of about 0.003 inches to 0.010 inches. The thickness of the adhesive layer 17 is about 0.003 inches. The thickness of the second layer 19 is about 0.125 inches.

An example of the material for use as the dielectric layer according to the present invention:

styrofoam dielectric constant 1.02 loss tangent 0.002

Figure 3:
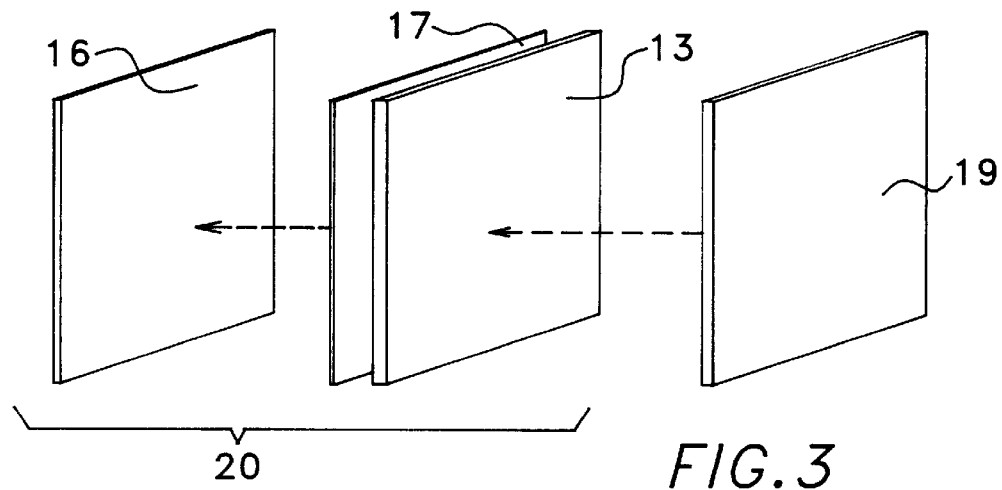
FIG. 3 is a schematic perspective view showing a portion of the method of making the sandwich for the antenna shown in FIGS. 1 and 2.
Figure 4:
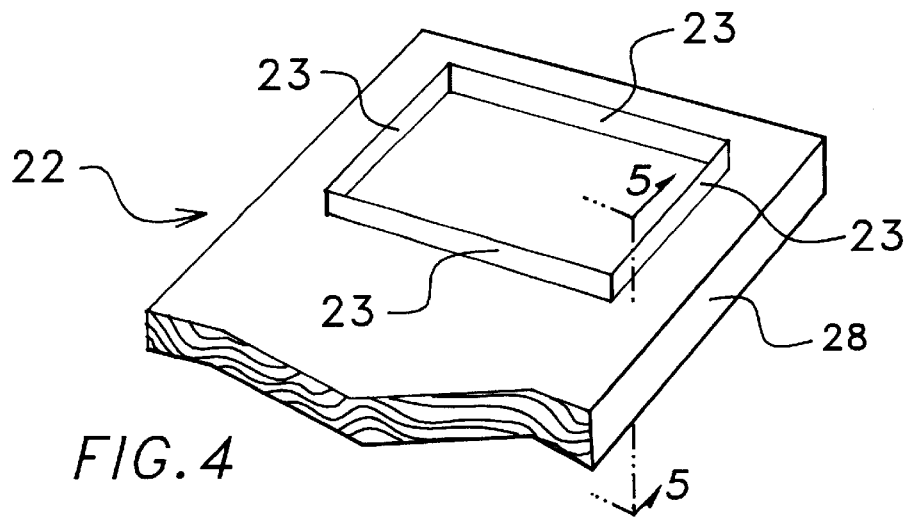
FIG. 4 is a perspective view of the cutting die used in making the antenna shown in FIGS. 1 and 2.
Figure 5:
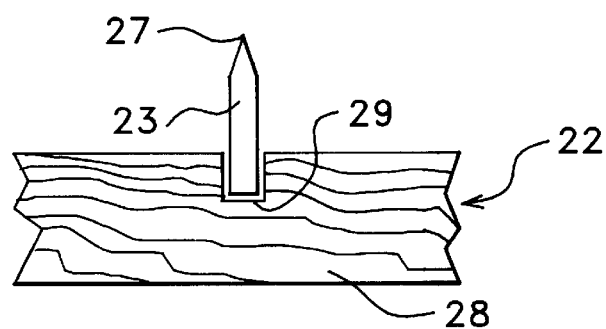
FIG. 5 is a sectional view taken along line 5—5 of FIG. 4 showing the cutting blade.

Referring now to FIGS. 3–7 the method and apparatus for making the antenna 12 will now be described. Sheets or sections of the dielectric substrate 13, adhesive layer 17 and first layer 16 are provided in preselected length and width dimensions as illustrated in FIG. 3 and are brought together to form a sandwich 20. A typical size for each section is 12 inches by 12 inches.

A cutting die 22 is used for forming the planar array shown in FIGS. 1 and 2. This cutting die 22 shown has four cutting blades 23, preferably a steel rule die, arranged end to end in a desired configuration of a desired size herein shown as a rectangular configuration. Each cutting blade 23 has a sharpened cutting edge 27. Each cutting blade 23 is of a selected length according to the size and shape of the planar array being cut and is mounted in a rigid backing member 28 preferably made of a hardwood material. The backing member 28 has a groove 29 into which one end of cutting blade 23 will slidably fit. The grooves may be cut by a laser or a fine coping saw or the like. The blade is fixedly secured as with a friction fit or using an adhesive. The blade 23 preferably is 0.030 inches thick. The rules or cutting blade 23 may be surrounded by foam pieces to hold the sandwiches in place during the cutting process. Dimensional tolerances of 0.005 inches can be held using this method making repeatability and ultimately the tuning of the antenna relatively easy.

The typical circuit for each of the planar arrays described herein is known as a microstrip radiator and follows the guide lines of a conventional or standard formula for such antennas as in the previously mentioned U.S. Patent. The dimensions of the planar arrays are called out on the drawings used to make the cutting die as opposed to drawings being used to make acetate artwork in the prior art photolithographic or etching methods of making. The drawings used are to scale to enable the diemaker to check the accuracy of the die.

Figure 6:
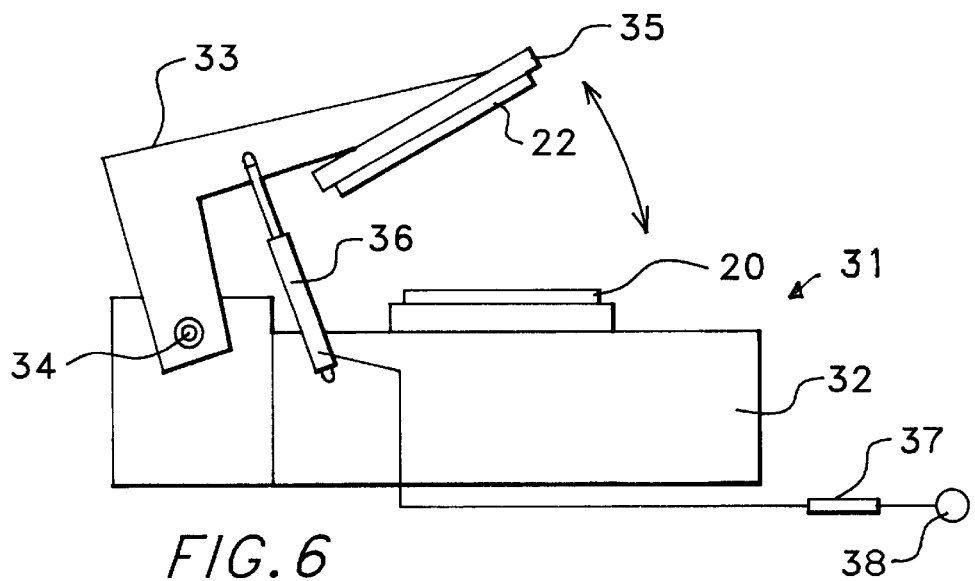
FIG. 6 is a side elevation of apparatus for making the antenna shown in FIGS. 1 and 2.
Figure 7:
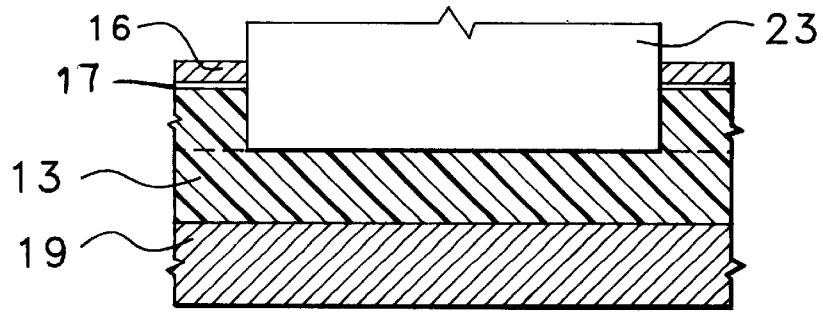
FIG. 7 shows the position of the cutting blade through the conductive first layer and into the dielectric substrate in the die cutting operation in making the antenna.

A cutting press 31 is shown in FIG. 6 for performing the cutting operation. The cutting press 31, briefly stated, is two plates that are pressed together and then retracted and as shown have a plate or base 32 and an L-shaped pivot arm 33 that pivots toward and away from the base 32 about a pivot 34. The cutting die 22 is mounted on a movable plate or head 35 on the pivot arm and the sandwich 20 is placed on the base 32. A linear actuator or two-way cylinder 36 is mounted between the base and pivot arm to selectively move the cutting die toward and down into a portion of the depth of the sandwich 20 and then back to the retracted position shown. The operation of the actuator 36 may be controlled as by a foot operated switch 37 connected to an actuating source 38 for the actuation. The cylinder typically has a spring to return arm 33 to the retracted position. The mechanism that does the pressing can be of a variety of types including hydraulic and electric.

Once the first layer 16 has been cut the excess material outside the cut is removed leaving only the rectangular planar array. The feedpin is soldered to the first layer 16. Finally a radome or protective covering (not shown) is placed over the sandwich and the second layer 19 is located on the second surface of the substrate to form the ground plane and an environmental seal (not shown) is placed around the perimeter.

Figure 8:
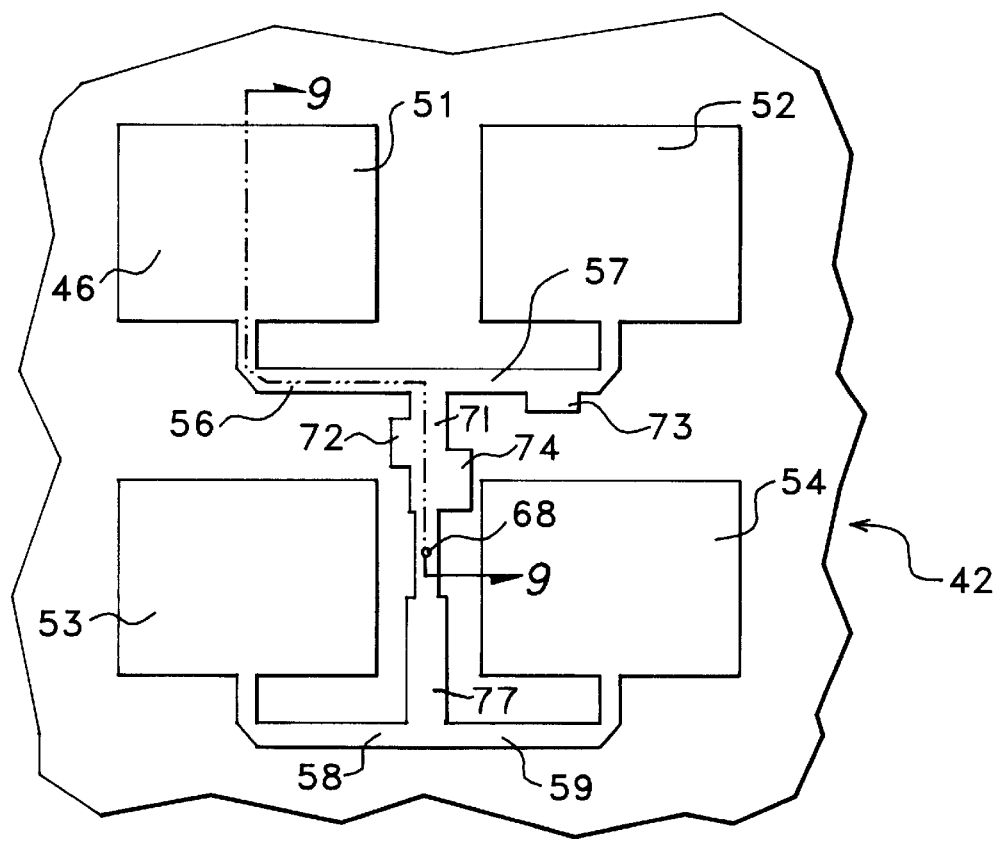
FIG. 8 is a top plan view of a four radiator element planar array antenna embodying features of the present invention.
Figure 9:
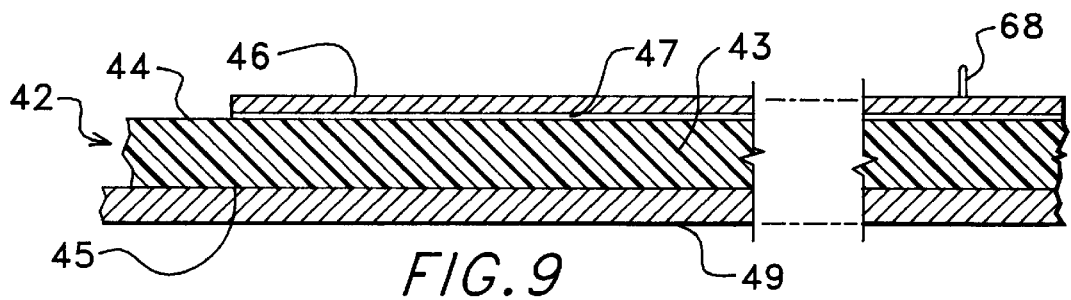
FIG. 9 is a sectional view taken along line 9—9 of FIG. 8.
Figure 10:
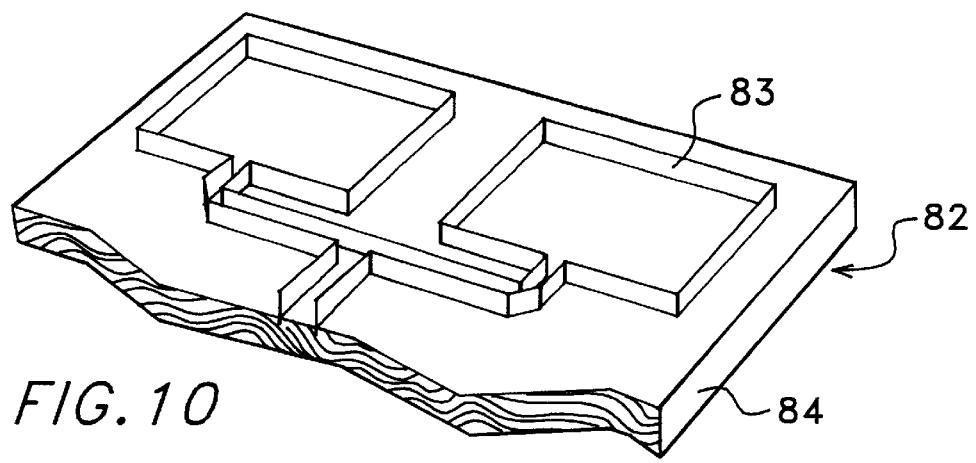
FIG. 10 is a perspective view of the cutting die for making the antenna shown in FIGS. 8 and 9.

Referring now to FIGS. 8 and 9 there is shown a four radiator element planar array antenna 42. The structure and method of making antenna 42 is substantially the same as antenna 12 above described. Antenna 42 has a dielectric substrate 43, preferably styrofoam, with a planar first surface 44 and a planar second surface 45 opposite the first surface 44.

A die cut thin conductive first layer 46 is secured to the first surface 44, preferably by means of an adhesive layer 47, preferably a sheet adhesive. A thin conductive second layer 49 is disposed on the second surface 45 to form a ground plane. The first layer 46 is die-cut to form a planar array which has four radiator elements each in the form of thin conductive patches 51, 52, 53 and 54 of rectangular shape and each of a corresponding size and shape.

A feedline 56 extends from an edge of the upper left patch 51 to a common feedpoint area. A feedline 57 extends from an edge of upper right patch 52 to a common feedpoint area. A feedline 58 extends from an edge of the lower left patch 53 to the common feed area. A feedline 59 extends from an edge of the lower right patch to the common feed area. A feedpoint pin 68 is soldered to the first layer at the common feedpoint area. Feedlines 56 and 57 form a common T with the lower leg 71 being of greater thickness than the upper legs and forming a transformer. A tuning stub 72 is provided in the lower leg in feedline 56 between the upper left patch 51 and feed pin 68. Two tuning stubs 73 and 74 are provided in feedline 57. Feedlines 58 and 59 form a common inverted T with the upper leg 77 being of greater thickness than the two lower legs and forming a transformer.

Each feedline is a thin conductive narrow strip. Each patch and associated feedline are made as a single integral strip of the same material preferably of the same conductive foil.

A cutting die 82 is shown in FIGS. 8 and 9 for forming the planar array. This cutting die 82 has a plurality of steel rule cutting blades 83 arranged in a particular configuration to form the selected planar array from the first layer. As above described, each cutting blade 83 is mounted in grooves in a rigid backing member 84. The procedure for forming the four element antenna is the same as the single element as above described.

Figure 11:
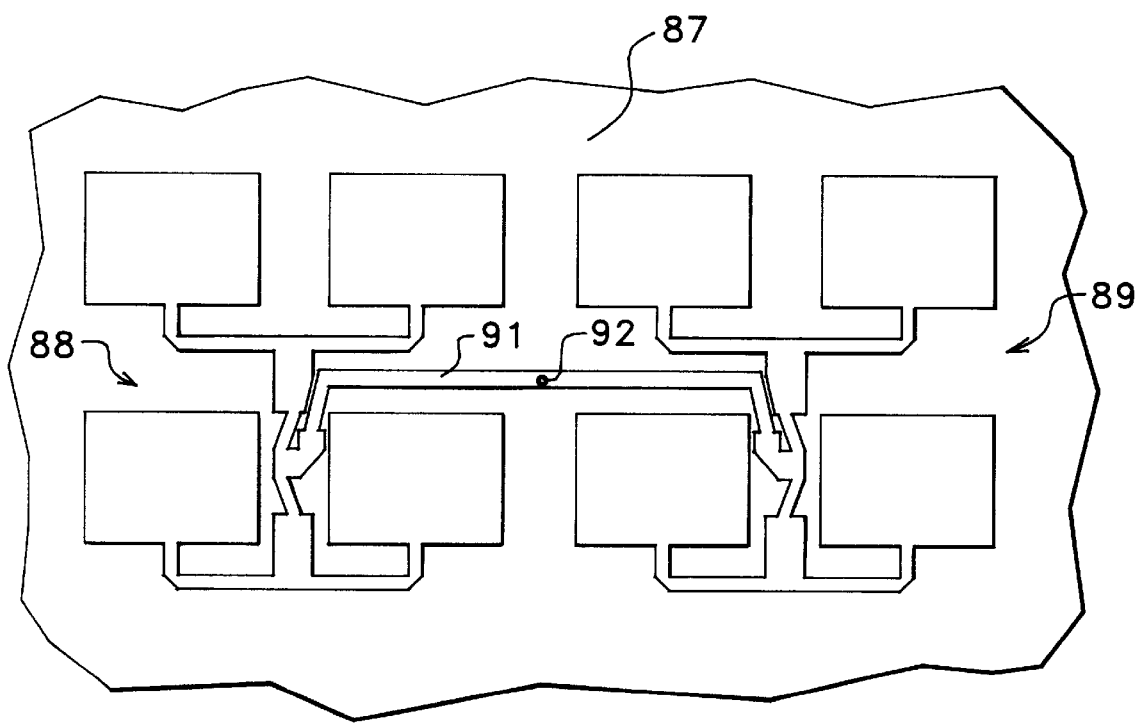
FIG. 11 is a top plan view of a planar array antenna using two groups of four radiator elements.

Referring now to FIG. 11 there is shown two four radiator element planar arrays. The antenna shown in FIG. 11 has a dielectric substrate 87 on which there is a planar array having a first four patch group 88 and a second four patch group 89 each similar to the four patch group shown in FIGS. 8 and 9 with a common conductive strip line 91 connected at one end to the common feedpoint area of group 88 and at the other end to the common feedpoint area of group 89 and having a common feedpin 92 at its midpoint.

Figure 12:
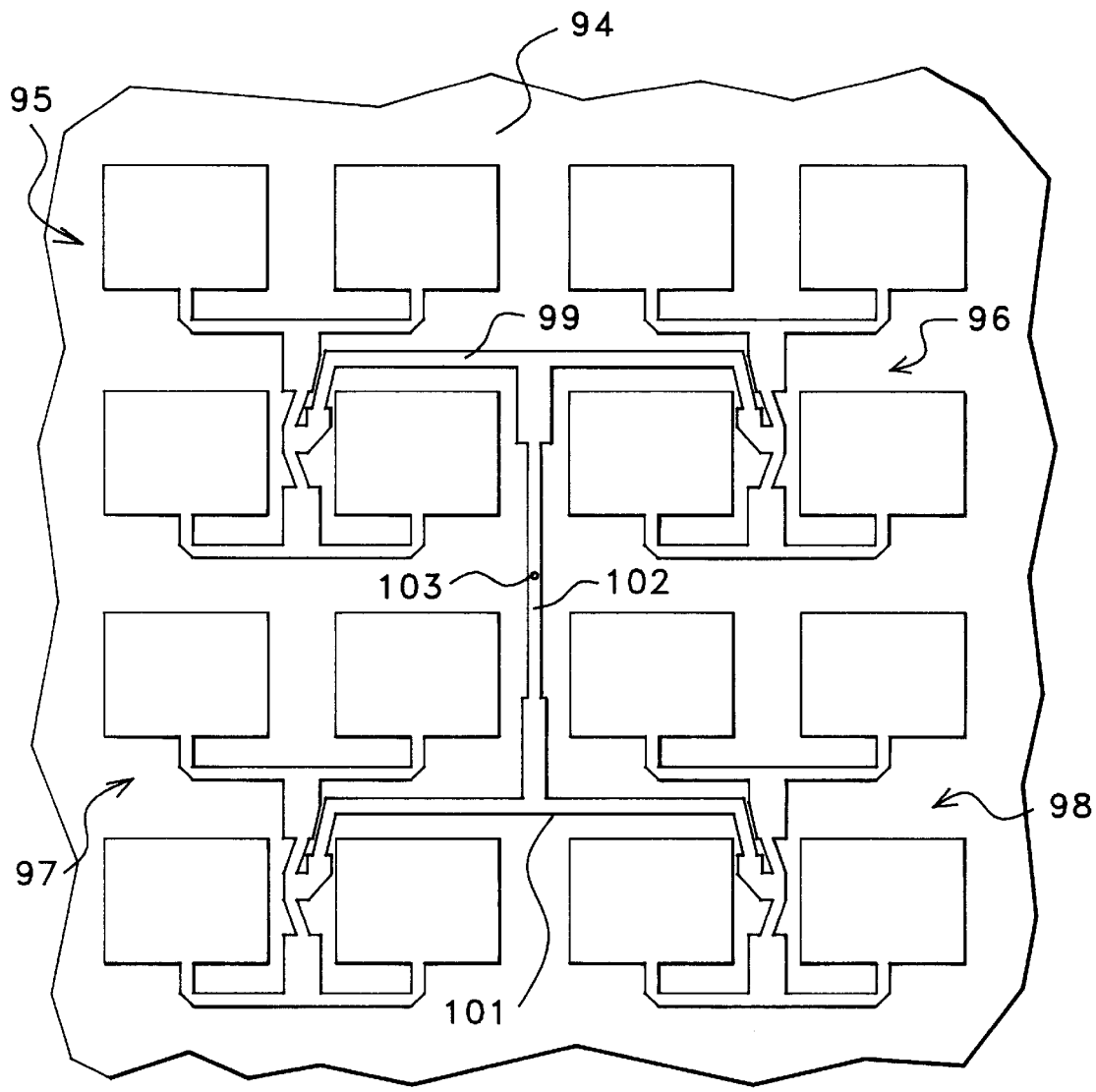
FIG. 12 is a top plan view of a planar array antenna having four groups of four radiator elements.

Referring now to FIG. 12 there are shown four radiator element planar arrays. The antenna shown in FIG. 11 has a dielectric substrate 94 on which there is a planar array having a first four patch group 95, a second four patch group 96, a third four patch group 97 and a fourth four patch group 98. There is a common conductive strip 99 connecting groups 95 and 96 and a common conductive strip 101 connecting groups 97 and 98 with a central conductive strip 102 joining strips 99 and 101 on which there is mounted at its midpoint a common feedpin 103. The additional arrays provide for increased gain.

From the foregoing it should be apparent that the method of making and the resulting product greatly simplifies the ability to make dimensionally sensitive antennas. Repeatability is excellent and volumes are high. There is a reduction in production costs as well as a reduction in materials.

Although the present invention has been described with a certain degree of particularity, it is understood that the present disclosure has been made by way of example and that changes in details of structure may be made without departing from the spirit thereof.

What is claimed is:

1. A method of making a planar antenna comprising the steps of:

providing a sandwich of a selected length and width having a dielectric substrate and a conductive first layer secured to a planar first surface of said substrate, cutting a complete peripheral outline of a single radiator element in said first layer with a die cutter so that said first layer is cut into said radiator element inside said outline and an excess portion outside of and entirely surrounding said outline, and removing said excess portion of said first conductive layer, and applying a second conductive layer to a planar second surface of said substrate opposite said radiator element to form a ground plane.

2. A method of making a planar array antenna comprising the steps of:

providing a dielectric substrate with a planar first surface and a planar second surface opposite said first surface, securing a conductive first layer over said first surface to form a sandwich, after said step of securing, cutting a complete peripheral outline of a planar array in said first layer with a die cutter so that said first layer is cut into said planar array inside said outline and an excess portion outside of and entirely surrounding said outline, after said step of cutting, removing said excess portion of said first layer, and after said step of removing, securing a conductive second layer to said second surface of said substrate to form a ground plane.

3. The method as set forth in claim 2 wherein said step of cutting consists of making a single cut with said die cutter.

4. The method as set forth in claim 3 further comprising the step of:

soldering a feedpin to said planar array after said step of removing said excess portion.

5. The method as set forth in claim 4 wherein said planar array includes a plurality of radiator elements, a common feedpoint area and a feedline from each said radiator element to said feedpoint area.

6. The method as set forth in claim 5 wherein said step cutting a complete peripheral outline includes cutting a complete peripheral outline of a plurality of planar arrays.

7. The method as set forth in claim 4 wherein said planar array is a single radiator element.

* * * * *